United States Patent
West et al.

(10) Patent No.: US 9,654,048 B2
(45) Date of Patent: May 16, 2017

(54) VARIABLE FREQUENCY DRIVE SELF-CHECK

(71) Applicant: Trane International Inc., Piscataway, NJ (US)

(72) Inventors: Nathan Thomas West, Holmen, WI (US); Benjamin James Sykora, Holmen, WI (US); Korwin Jay Anderson, Holmen, WI (US); Matthew August Shepeck, LaCrosse, WI (US); David Marshall Foye, LaCrosse, WI (US)

(73) Assignee: Trane International Inc., Piscataway, NJ (US)

( * ) Notice: Subject to any disclaimer, the term of this patent is extended or adjusted under 35 U.S.C. 154(b) by 14 days.

(21) Appl. No.: 14/791,858

(22) Filed: Jul. 6, 2015

(65) Prior Publication Data
US 2016/0056750 A1 Feb. 25, 2016
US 2016/0329854 A9 Nov. 10, 2016

Related U.S. Application Data

(63) Continuation of application No. PCT/US2014/012627, filed on Jan. 23, 2014.
(Continued)

(51) Int. Cl.
*H02P 23/00* (2016.01)
*H02P 29/024* (2016.01)
(Continued)

(52) U.S. Cl.
CPC .......... *H02P 29/024* (2013.01); *G01R 31/42* (2013.01); *H02M 1/32* (2013.01); *H02M 1/36* (2013.01);
(Continued)

(58) Field of Classification Search
CPC ............ H02P 6/34; H02P 27/08; H02P 21/06
(Continued)

(56) References Cited

U.S. PATENT DOCUMENTS 4,968,338 A * 11/1990 Sugiyama ............. F04B 49/065
361/22
5,446,354 A * 8/1995 Hiruma .................. G01R 31/34
318/400.09
(Continued)

FOREIGN PATENT DOCUMENTS

JP 2005160136 6/2005
WO 2011064277 6/2011

*Primary Examiner* — Rina Duda
(74) *Attorney, Agent, or Firm* — Taft Stettinius & Hollister LLP

(57) ABSTRACT

Diagnostic and/or control methods, systems and apparatuses for variable frequency drives are disclosed. The variable frequency drive may be controlled by a controller that may conduct one or more tests or evaluations. The tests or evaluations may include determining whether a switching device in the variable frequency drive is open-circuited, short-circuited, or operating normally. The tests may include determining whether current provided at an inverter output of the variable frequency drive is within a predetermined range. An exemplary embodiment evaluates the drive for a short circuit condition, an open circuit condition, and a sensor error or failure condition, controls operation of the drive based upon these one or more evaluations, may abort operation of the drive based upon one or more evaluations, and may set a fault code indicative of the type of error encountered.

29 Claims, 8 Drawing Sheets

Related U.S. Application Data

(60) Provisional application No. 61/755,713, filed on Jan. 23, 2013.

(51) Int. Cl.
*H02P 29/02* (2016.01)
*H02P 1/02* (2006.01)
*H02M 1/32* (2007.01)
*H02M 1/36* (2007.01)
*H02M 7/5387* (2007.01)
*G01R 31/42* (2006.01)
*H02M 5/458* (2006.01)
*G01R 31/02* (2006.01)

(52) U.S. Cl.
CPC ........ *H02M 7/53871* (2013.01); *H02P 1/022* (2013.01); *H02P 29/021* (2013.01); *H02P 29/0241* (2016.02); *G01R 31/025* (2013.01); *G01R 31/026* (2013.01); *H02M 5/458* (2013.01)

(58) Field of Classification Search
USPC ................................................ 318/798, 800
See application file for complete search history.

(56) References Cited

U.S. PATENT DOCUMENTS

| | | | |
|---|---|---|---|
| 6,056,384 | A | 5/2000 | Sato et al. |
| 6,097,582 | A | 8/2000 | John et al. |
| 6,153,993 | A * | 11/2000 | Oomura ............... H02P 6/34 318/434 |
| 6,377,859 | B1 | 4/2002 | Brown et al. |
| 6,392,859 | B1 | 5/2002 | Ohshima |
| 6,429,612 | B1 | 8/2002 | Kume et al. |
| 6,927,988 | B2 | 8/2005 | Cheng et al. |
| 7,246,500 | B2 | 7/2007 | Singh et al. |
| 7,345,383 | B2 | 3/2008 | Zhushi et al. |
| 7,719,217 | B2 | 5/2010 | Yokota et al. |
| 8,004,226 | B2 * | 8/2011 | Hartman ............. H02P 29/0241 318/474 |
| 8,138,704 | B2 | 3/2012 | Chakrabarti |
| 2009/0140745 | A1 | 6/2009 | Williams et al. |
| 2009/0241592 | A1 | 10/2009 | Stover |
| 2011/0292696 | A1 | 12/2011 | Xiao et al. |

\* cited by examiner

VARIABLE FREQUENCY DRIVE SELF-CHECK

BACKGROUND

Variable frequency drives may handle high voltages and high currents depending on the application. If there are any failures in the variable frequency drive, an individual may be seriously injured or other components of or connected to the variable frequency may be damaged. There is a need to provide diagnostics and/or controls capable of evaluating one or more error or failure conditions of a drive and controlling operation of the drive accordingly. Existing approaches suffer from various shortcomings relative to these and other needs such as the need for cumbersome and expensive equipment, computational complexity and inefficiency, failsafe shortcomings and others. There remains a need for the unique and inventive apparatuses, methods and systems disclosed herein.

SUMMARY

An exemplary embodiment is a diagnostic and control method for a variable frequency drive. The exemplary method evaluates the drive for a short circuit condition, an open circuit condition, and/or a sensor error or failure condition. The exemplary method controls operation of the drive based upon these one or more evaluations. In certain forms the method may abort operation of the drive based upon one or more evaluations. In certain forms the method sets a fault code indicative of the type of error encountered. Other embodiments include apparatuses, systems, devices, hardware, methods, and combinations for a variable frequency drive. Further embodiments, forms, features, aspects, benefits, and advantages of the present application shall become apparent from the description and figures provided herewith.

BRIEF DESCRIPTION OF THE FIGURES

The description herein makes reference to the accompanying figures wherein like reference numerals refer to like parts throughout the several views, and wherein.

DETAILED DESCRIPTION OF EXEMPLARY EMBODIMENTS

Figure 1:
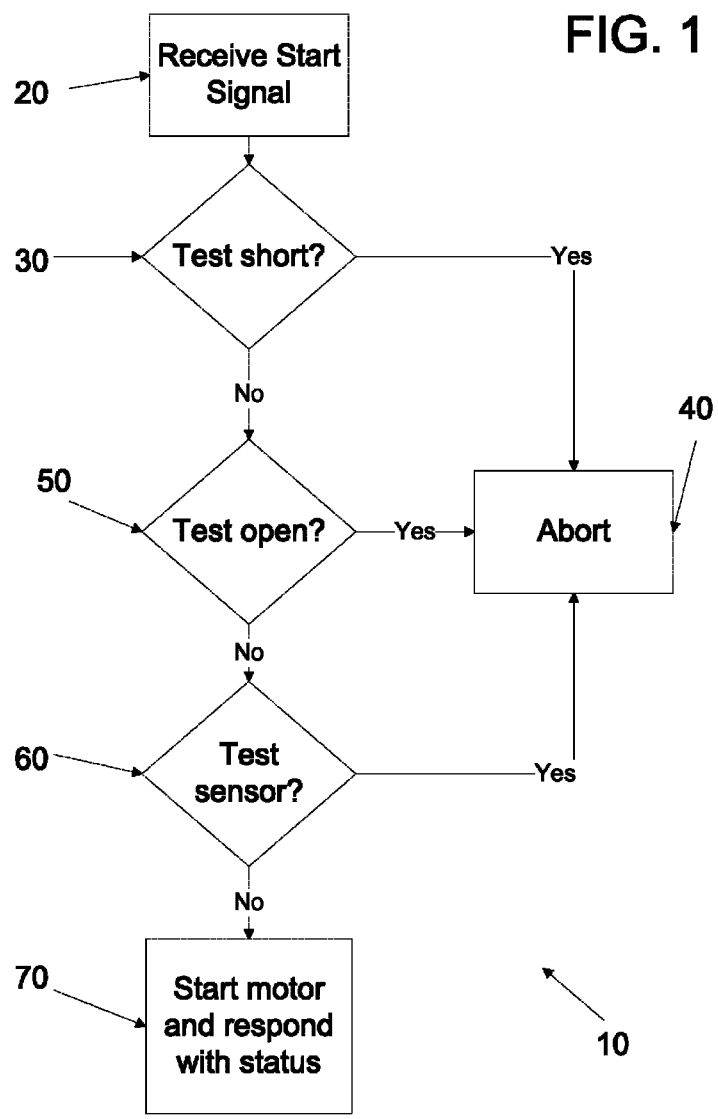
FIG. 1 is a schematic flow diagram of a process for testing a variable frequency drive.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 is a schematic flow diagram of a process 10 for testing a variable frequency drive, which may be performed during a startup mode or at other points of operation of the variable frequency drive. Operations illustrated for all of the processes in the present application are understood to be examples only, and operations may be combined or divided, and added or removed, as well as re-ordered in whole or in part, unless explicitly stated to the contrary.

Process 10 begins at operation 20, where a controller in the variable frequency drive receives a signal to start the motor. Before powering and starting the motor, the variable frequency drive conducts a series of tests to ensure that the variable frequency drive is operating correctly. From operation 20, process 10 proceeds to operation 30. Operation 30 is a process for determining whether there is a short circuit in the variable frequency drive. For example, operation 30 may determine whether any switching device, such as a transistor, in an inverter of the variable frequency drive is short-circuited. If any switching device is short-circuited, process 10 proceeds to operation 40 in which process 10 is aborted. If none of the switching devices tested are short-circuited, process 10 proceeds to operation 50.

Operation 50 determines whether there is an open circuit in the variable frequency drive. For example, operation 50 may determine whether any switching device, such as a transistor, in the inverter of the variable frequency drive is open-circuited. If one or more of the switching device is open-circuited, process 10 proceeds to operation 40 in which process 10 is aborted. If none of the switching devices tested are open-circuited, process 10 proceeds to operation 60.

Operation 60 determines whether there are any sensor errors or failures, such as current sensor failures, based on an evaluation of the current flowing in the variable frequency drive. If there is a sensor error or failure, process 10 proceeds to operation 40 in which process 10 is aborted. If there are no sensor errors or failures, process 10 proceeds to operation 70 in which the motor is started and the controller responds with the status of process 10.

In operation 40, in addition to aborting process 10, the controller may illuminate one or more status indicators that indicate a failure and the type of failure that occurred such as a short-circuited switching device, an open-circuited switching device, or a sensor failure. The status indicator may be an LED that is visible to a technician or another person inspecting the system 100. In operation 40, the controller may transmit an error code or the status of the variable frequency drive to an interface for a computer or handheld diagnostic tool to read. The interface may be wired or wireless. The controller may store an error code in its memory. Additionally, the status indicator and/or the error code may provide information that identifies the precise failure that occurred, e.g., the upper U-phase transistor is short-circuited.

In operation 70, generally the variable frequency drive will deliver power to the motor if no failure is detected. The controller may illuminate one or more of the status indicators to indicate that the variable frequency drive and/or motor was started successfully. In operation 70, the controller may transmit a code or status of the variable frequency drive to an interface for a computer and/or handheld diagnostic tool to read. The controller may store a code in its memory. In addition, once the motor is started, the startup mode 10 is exited and control of the variable frequency drive will be conducted in a normal operating mode.

It is contemplated that only one of the processes 30, 50, 60 or any combination of the processes 30, 50, 60 may be used in process 10 to verify that the variable frequency drive is operating correctly. In addition, it is contemplated that other processes and other tests may be used in combination with one or more of the processes 30, 50, and 60.

Figure 2:
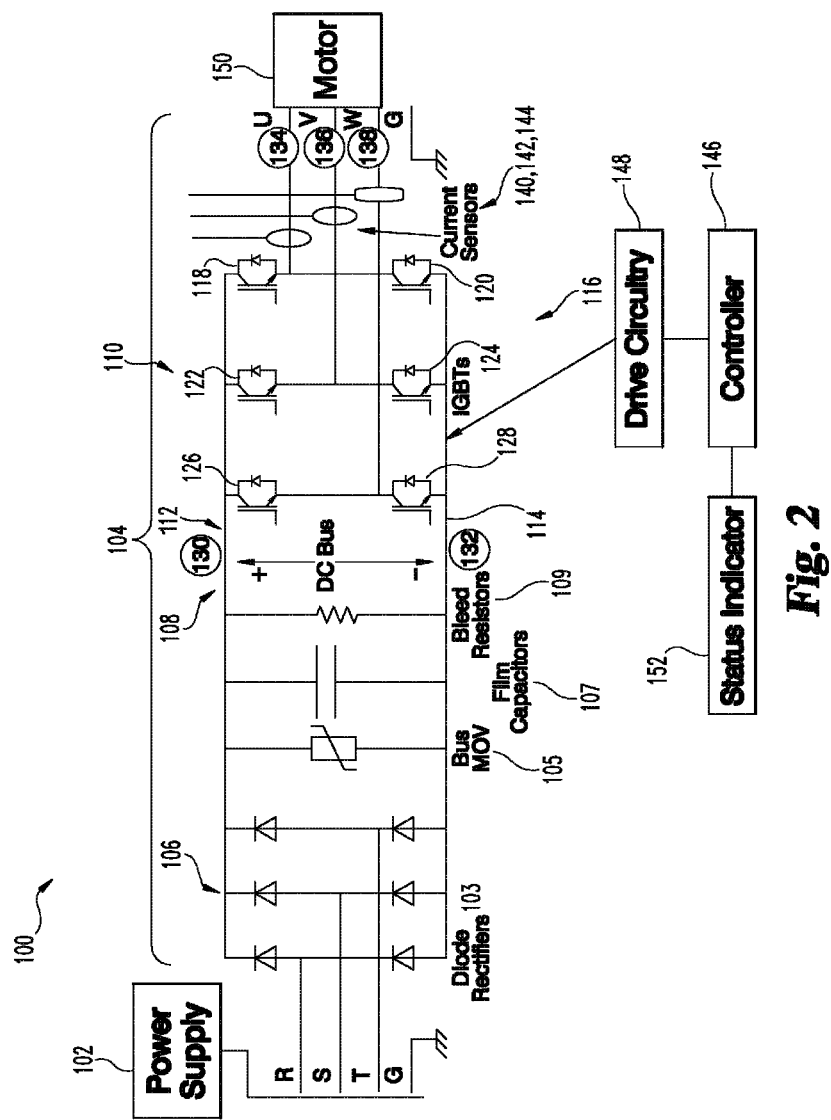
FIG. 2 is a schematic block diagram of a system including a variable frequency drive.

FIG. 2 is a schematic block diagram of a system 100. The system 100 may be for a heating, ventilating, cooling, or refrigeration (HVACR) system or any other type of system that utilizes a variable frequency drive. The system 100 includes a power supply 102 to supply AC power to a variable frequency drive 104. The AC power from the power supply 102 is shown as three phase AC power with lines R, S, T, but the AC power may have a different number of phases.

The variable frequency drive 104 includes a rectifier 106, a DC bus 108, and an inverter 110. The rectifier 106 includes diodes 103 and receives the three phase AC power from the power supply 102. The rectifier 106 converts the AC power into DC power and supplies the DC power to the DC bus 108. Although FIG. 2 illustrates the power supply 102 connected to the rectifier inputs R, S, T, it is contemplated that other circuitry or components such as reactors and/or transformers may be included between the power supply 102 and rectifier inputs R, S, T. The variable frequency drive 104 may also include other circuitry or components such as a metal oxide varistor (MOV) 105, a capacitor 107, and/or a resistor 109.

The DC bus 108 delivers the DC power to the inverter 110 via two bus rails: a positive DC bus rail 112 and a negative DC bus rail 114. It shall be understood that the terms positive and negative in this context are relative and that the actual polarities may be both positive, both negative, positive and negative, positive and zero, or negative and zero in various embodiments. The inverter 110 receives DC power from the DC bus 108, and in particular, the positive DC bus rail 112 and the negative DC bus rail 114, and converts the DC power into AC power.

The inverter 114 includes one or more switching devices. For example, the switching device may be one or multiple transistors, a pair of transistors, or multiple pairs of transistors. FIG. 2 illustrates the switching device as including three pairs of transistors 116, where each pair of transistors 116 corresponds to one phase of AC power. In the illustrated embodiment, the transistors 116 are insulated gate bipolar transistors. However, it is contemplated that other types of transistors may be used as known to those skilled the art. In addition, the switching device may be another type of electrical component that provides switching functionality other than a transistor.

Each pair of transistors includes an upper transistor coupled to the positive DC bus rail 112 and a lower transistor coupled to the negative DC bus rail 114. In particular, transistor 118 is the upper transistor for the U phase, transistor 120 is the lower transistor for the U-phase, transistor 122 is the upper transistor for the V-phase, transistor 124 is the lower transistor for the V-phase, transistor 126 is the upper transistor for the W-phase, and transistor 128 is the lower transistor for the W-phase.

The system 100 includes two DC bus voltage sensors to measure the voltage on the DC bus 108. The positive DC voltage sensor 130 measures the voltage on the positive DC bus rail 112. The negative DC voltage sensor 132 measures the voltage on the negative DC bus rail 114.

The system 100 includes three output voltage sensors to measure the output voltage of each phase of the inverter 110. Sensor 134 measures the output voltage of the U-phase. Sensor 136 measures the output voltage of the V-phase. Sensor 138 measures the output voltage of the W-phase. The output voltage sensors 134, 136, 138 may be located at a node in electrical communication with the output of its corresponding transistor(s). The output voltage sensors 134, 136, 138 may be located at corresponding terminals of the inverter or motor.

The system 100 includes three current sensors to measure the output current in each phase of the inverter 110. Sensor 140 measures current in the U-phase. Sensor 142 measures current in the V-phase. Sensor 144 measures current in the W-phase. The current sensors 140, 142, 144 may be located at a node in electrical communication with the output of its corresponding transistor(s). The current sensors 140, 142, 144 may be located at corresponding terminals of the inverter or motor. In some embodiments, the system 100 includes only two current sensors, e.g., to measure the current in the U-phase and the V-phase.

The system 100 further includes a controller 146 to control the variable frequency drive 104, receive measurements from various sensors, and execute instructions or operations in the various techniques disclosed in this application, among other things. The controller 146 is coupled to driver circuitry 148, which is electrically connected to the gates of each of the transistors 116 (for clarity of illustration the connection is not depicted). This connection allows, among other things, the controller 146 to switch the transistors 116 on and off to generate a pulse width modulated signal or other control signal provided to the motor 150. The motor 150 may drive a compressor that is part of a HVACR system.

The controller 146 is also connected to the voltage sensors 130, 132, 134, 136, 138 and the current sensors 140, 142, 144. Furthermore, the controller 146 is configured with operating logic or instructions to execute the operations in process 10 utilizing the data from voltage sensors 130, 132, 134, 136, 138 and current sensors 140, 142, 144. In addition, the controller 146 may be coupled to a status indicator 152, which may be, e.g., one or more light emitting diodes (LEDs). Other embodiments may utilize only two of current sensors 140, 142, 144, for example, sensors 140 and 142.

Although FIG. 2 illustrates the inverter output signals U, V, W connected to the motor 150, other circuitry and/or components such as inductors (not shown) may be included between the inverter outputs and the motor 150. In addition, although the inverter 110 provides three phase AC power, it is contemplated that the inverter 110 may be reconfigured to supply AC power with a different number of phases.

Figure 3:
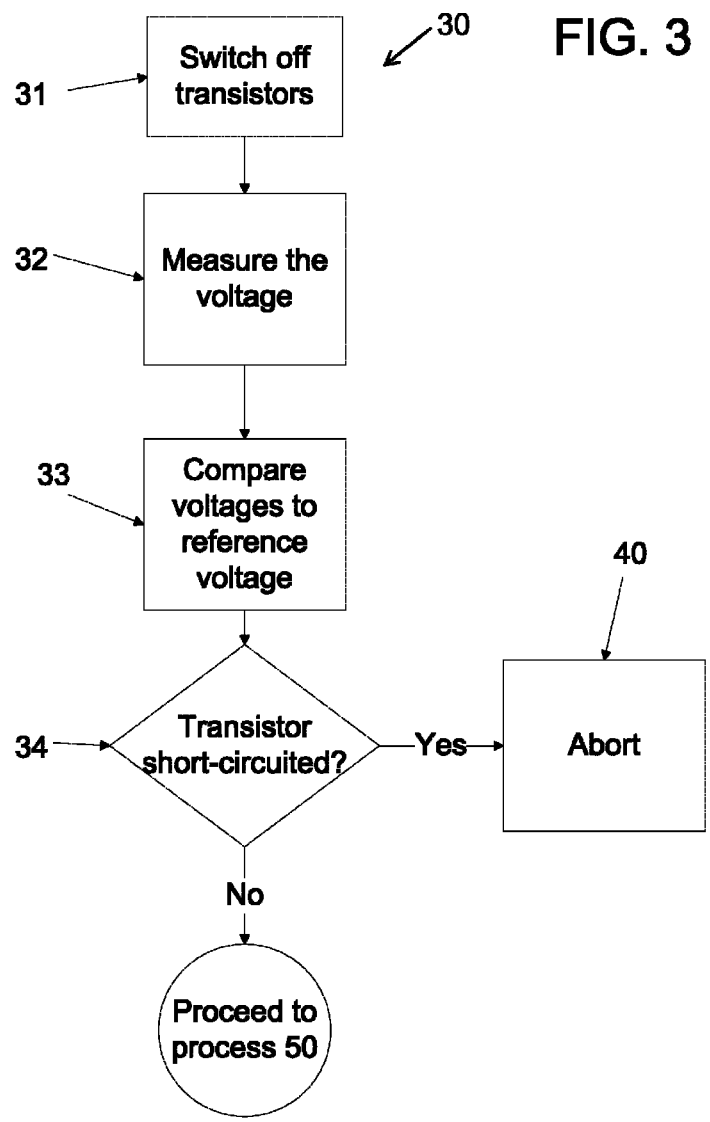
FIG. 3 is a schematic flow diagram of a process for determining whether there is a short circuit condition.

FIG. 3 is a schematic flow diagram for a process 30 for determining whether any of the transistors 116 is short-circuited. At operation 31, the controller 146 switches off all of the transistors 116. From operation 31, process 30 proceeds to operation 32. At operation 32, the controller 146 receives the voltage readings from one or both of the DC bus voltage sensors 130, 132 and one or multiple of the output voltage sensors 134, 136, 138. The voltage readings may occur over a period of time, e.g., one power cycle. Moreover, the voltage readings may be an average or a median of multiple readings or a threshold value over a given period of time.

At operation 33, the controller 146 compares at least one of the output voltage readings and at least one of the DC bus voltage readings to a reference voltage, such as logic common, to determine voltage differences. It is contemplated that a reference voltage or reference value may be other than logic common as well.

At operation 34, the controller 146 determines whether one or multiple of the transistors 116 are short-circuited based on the voltage differences by comparing a voltage difference for one of the three output voltages to one or both of the voltage differences for the two DC bus voltages. For example, if the voltage difference between the U-phase voltage and logic common is approximately the same as the voltage difference between the positive DC bus voltage and logic common, the upper transistor 118 on the U phase is short-circuited because the voltage on the U-phase is being pulled to the voltage on the positive DC bus rail 112 when the transistor 118 is switched off. Similarly, if the voltage difference between the U-phase voltage and logic common is not approximately the same as the voltage difference between the positive DC bus voltage and logic common, the upper transistor 118 on the U-phase is not short-circuited. This comparison may be done for all of the transistors 116 collectively or for each transistor individually to determine if any are short-circuited. Moreover, a short circuit test may be conducted for one or multiple transistors or for one or multiple phases.

If a transistor 116 is short-circuited, then process 30 proceeds to operation 40, which, as described above, process 10 is aborted, among other things. If none of the transistors 116 tested are short-circuited, process 10 proceeds to process 50.

Figure 4:
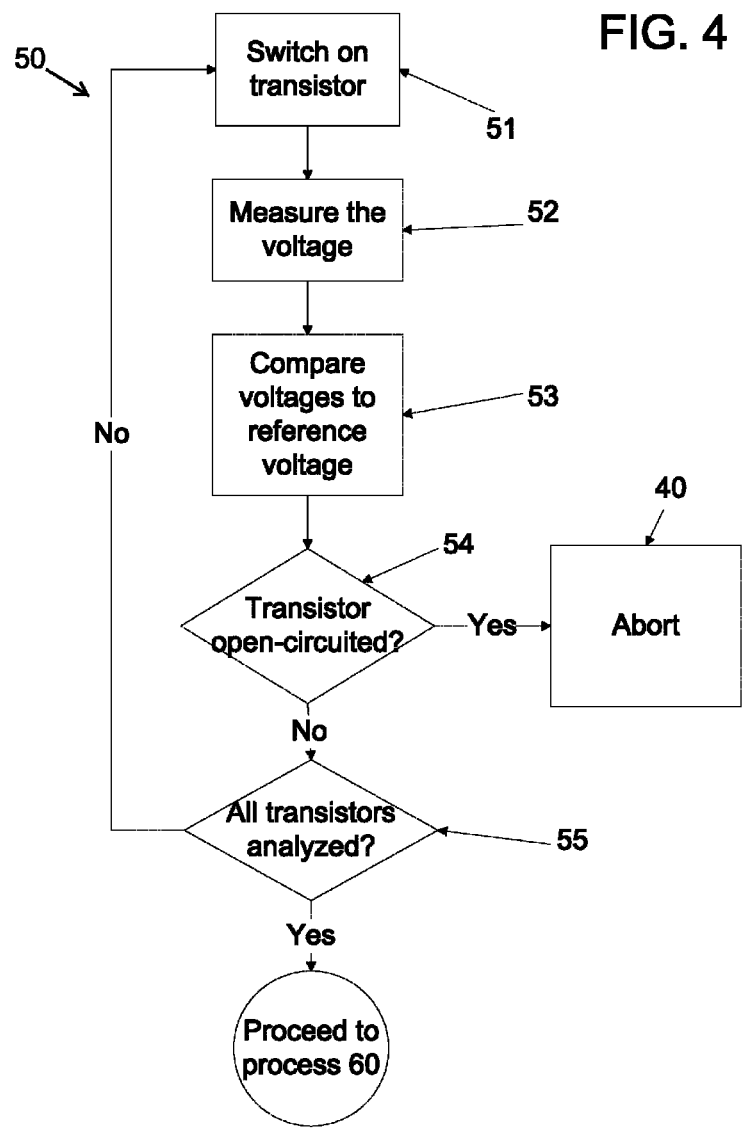
FIG. 4 is a schematic flow diagram of a process for determining whether there is an open circuit condition.

FIG. 4 is a schematic flow diagram for a process 50 for determining whether any transistor is open-circuited. At operation 51, the controller 146 switches on transistor 118. From operation 61, process 50 proceeds to operation 52. At operation 52, the controller 146 receives the voltage reading from the output voltage sensor 134 and the corresponding voltage reading from the DC bus voltage sensor 130. The voltage readings may occur over a period of time, e.g., one power cycle. Furthermore, the voltage readings may be an average or a median of multiple readings or a threshold value over a given period of time. At operation 53, the controller 146 compares the two voltage readings to a reference voltage, such as logic common, to determine two voltage differences. It is contemplated that a reference voltage or reference value may be other than logic common as well.

At operation 54, the controller 146 determines whether the transistor 118 is open-circuited by determining if the two voltage differences are approximately the same. If the two voltage differences are approximately the same, the transistor 118 is not open-circuited. If the two voltage differences are not approximately the same, then the transistor 118 is open-circuited. This is because when the upper U-phase transistor 118 is switched on, the voltage at the positive DC bus rail 112 should be the same as the voltage of the output of the U-phase.

If the transistor 118 is open-circuited, then process 50 proceeds to operation 40, which, as described above, process 10 is aborted, among other things. If the transistor 118 is not open-circuited, process 50 proceeds to operation 55, which determines whether all of the transistors 116 have been analyzed or whether all of the transistors should be analyzed to determine if they are open-circuited. Process 50 may be repeated for each of the transistors 116 and if none of the transistors 116 tested are open-circuited, process 10 proceeds to process 60.

Figure 5:
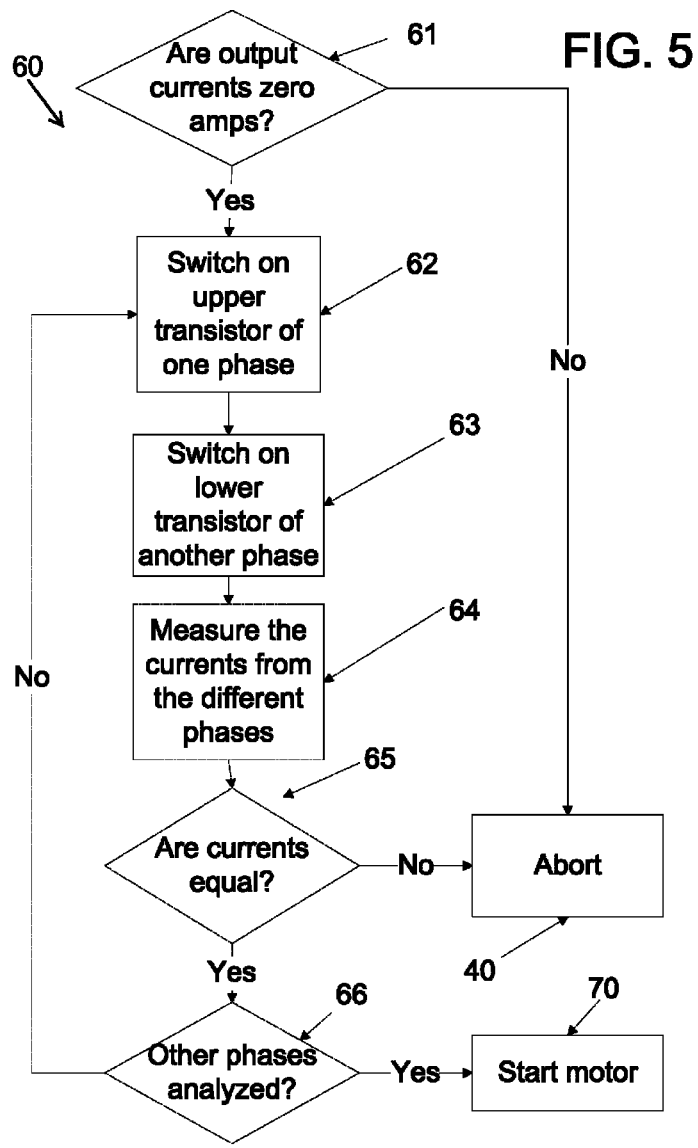
FIG. 5 is a schematic flow diagram of a process for determining whether there is a sensor error or failure condition.

FIG. 5 is a schematic flow diagram for a process 60 for determining whether there is a sensor error or failure. At operation 61, the controller 146 measures the output current for one or multiple phases of the inverter 110 using the current sensors 140, 142, and/or 144 when the transistors 116 are switched off. The controller 146 confirms that at least one of the currents in one phase is approximately zero amps or within a predetermined range. If the current in a phase is not approximately zero amps or within a predetermined range, the controller 146 may recalibrate the appropriate current sensor 140, 142, or 144. Once the measured current in the tested phases is approximately zero amps, process 60 proceeds to operation 62. It is contemplated that operation 61 may not be performed in some implementations.

From operation 61, process 60 proceeds to operation 62. At operation 62, the controller 146 switches on an upper transistor in one phase such as the upper transistor 118 in the U-phase. From operation 62, process 60 proceeds to operation 63. At operation 63, the controller 146 switches on a lower transistor in another phase such as the lower transistor 124 in the V-phase.

From operation 63, process 60 proceeds to operation 64. At operation 64, the controller 146 measures the current flowing in the U-phase with the current sensor 140 and measures the current flowing in the V-phase with the current sensor 142. The current readings for operations 61 and 64 may occur over a period of time, e.g., one power cycle. Furthermore, the current readings may be an average or a median of multiple readings or a threshold value over a given period of time.

From operation 64, process 60 proceeds to operation 65. At operation 65, the controller 146 determines whether the two current readings are approximately the same, but of opposite polarity. Furthermore, the current should flow through the upper transistor, then through the motor 150, and then through the lower transistor of the other phase in the opposite polarity.

If the current readings are not approximately the same and opposite in polarity then a circuit or sensor failure has occurred, and process 60 proceeds to operation 40, which, as described above, the startup mode 10 is aborted, among other things. If the current readings are approximately the same but in opposite polarity, then process 60 proceeds to operation 66 to determine whether other combinations have been analyzed or should be analyzed such as switching on the upper V-phase transistor 122 and the lower U-phase transistor 120. In additional embodiments, all three phases may be turned on and the output current may be detected as divided between two phases or doubled depending on whether two of the switches that are turned on are coupled to the positive DC bus or to the negative DC bus.

In embodiments where the system 100 includes only two current sensors, e.g., to measure the current in the U-phase and V-phase, the above-described analysis may be conducted using the two current sensors to measure current only in two phases. For example, the analysis may be conducted only when the upper U-phase transistor and the lower V-phase transistor are turned on.

If all of the desired combinations for current analyses have been completed, process 60 proceeds to operation 70 in which the motor 150 is started and the status is reported. For example, the status indicator 152 may be illuminated to indicate the motor 150 has been started. Moreover, the start status may be stored in the memory by the controller 146 where it can be transmitted to another device such as a computer or handheld diagnostic tool.

In processes 30, 50, 60, some of the comparisons or evaluations of voltages and/or currents may refer to "approximately." As used herein, "approximately" is to generally account for the error or impreciseness of measuring a voltage or current or they may change over small amounts of time. The number of volts or amps that are acceptable under "approximately" depends on the system. In some systems, less than one volt or one amp may be acceptable, but in other systems, several volts or several amps will be within "approximately." In addition, even if a comparison or evaluation does not refer to "approximately," the present application presumes that there is an accounting for the impreciseness in the system.

Figure 6:
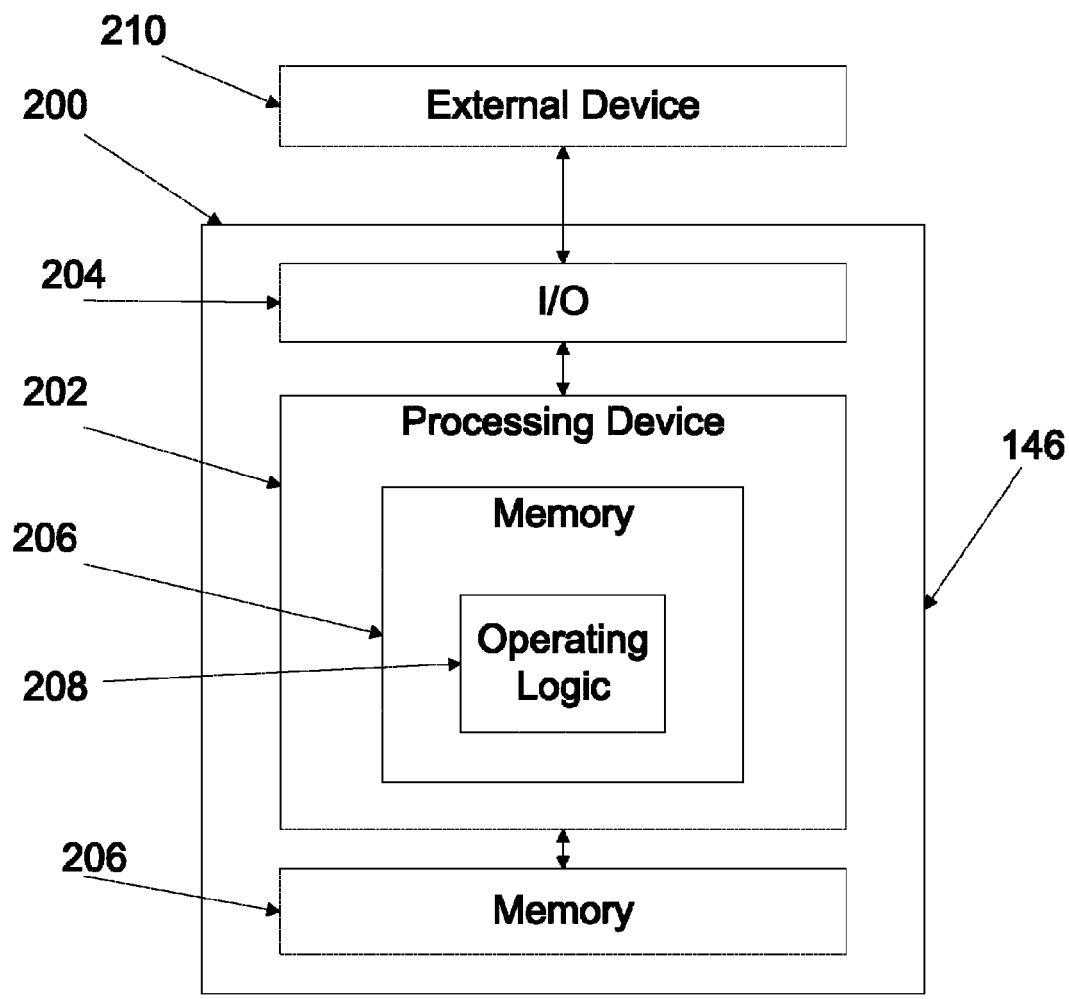
FIG. 6 is a schematic block diagram of a controller.

FIG. 6 is a schematic block diagram of a controller 200. The controller 200 is one example of a controller configuration which may be utilized in connection with the controller 146 shown in FIG. 2. Controller 200 includes a processing device 202, an input/output device 204, memory 206, and operating logic 208. Furthermore, controller 200 communicates with one or more external devices 210.

The input/output device 204 allows the controller 200 to communicate with the external device 210. For example, the input/output device 204 may be a network adapter, network card, interface, or a port (e.g., a USB port, serial port, parallel port, VGA, DVI, HDMI, FireWire, CAT 5, or any other type of port or interface). The input/output device 204 may be comprised of hardware, software, and/or firmware. It is contemplated that the input/output device 204 includes more than one of these adapters, cards, or ports.

The external device 210 may be any type of device that allows data to be inputted or outputted from the controller 200. For example, the external device 210 may be a handheld computer or diagnostic tool, a computer, a server, a printer, a display, an alarm, an illuminated indicator such as status indicator 152, a keyboard, a mouse, or a touch screen display. Furthermore, it is contemplated that the external device 210 may be integrated into the controller 200. It is further contemplated that there may be more than one external device in communication with the controller 200. The status indicator 152 is one example of an external device 210.

Processing device 202 can be of a programmable type, a dedicated, hardwired state machine, or a combination of these; and can further include multiple processors, Arithmetic-Logic Units (ALUs), Central Processing Units (CPUs), Digital Signal Processors (DSPs) or the like. For forms of processing device 202 with multiple processing units, distributed, pipelined, and/or parallel processing can be utilized as appropriate. Processing device 202 may be dedicated to performance of just the operations described herein or may be utilized in one or more additional applications. In the depicted form, processing device 202 is of a programmable variety that executes algorithms and processes data in accordance with operating logic 208 as defined by programming instructions (such as software or firmware) stored in memory 206. Alternatively or additionally, operating logic 208 for processing device 202 is at least partially defined by hardwired logic or other hardware. Processing device 202 can be comprised of one or more components of any type suitable to process the signals received from input/output device 204 or elsewhere, and provide desired output signals. Such components may include digital circuitry, analog circuitry, or a combination of both.

Memory 206 may be of one or more types, such as a solid-state variety, electromagnetic variety, optical variety, or a combination of these forms. Furthermore, memory 206 can be volatile, nonvolatile, or a combination of these types, and some or all of memory 206 can be of a portable variety, such as a disk, tape, memory stick, cartridge, or the like. In addition, memory 206 can store data that is manipulated by the operating logic 208 of processing device 202, such as data representative of signals received from and/or sent to input/output device 204 in addition to or in lieu of storing programming instructions defining operating logic 208, just to name one example. As shown in FIG. 6, memory 206 may be included with processing device 202 and/or coupled to the processing device 202. For example, the memory 206 may store the code(s) or statuses of a successful or unsuccessful startup as described above.

The processes 10, 30, 50, 60 may be implemented in operating logic 208 as operations by software, hardware, artificial intelligence, fuzzy logic, or any combination thereof, or at least partially performed by a user or operator. In certain embodiments, modules represent software elements as a computer program encoded on a computer readable medium, wherein the controller 146 performs the described operations when executing the computer program.

Figure 7:
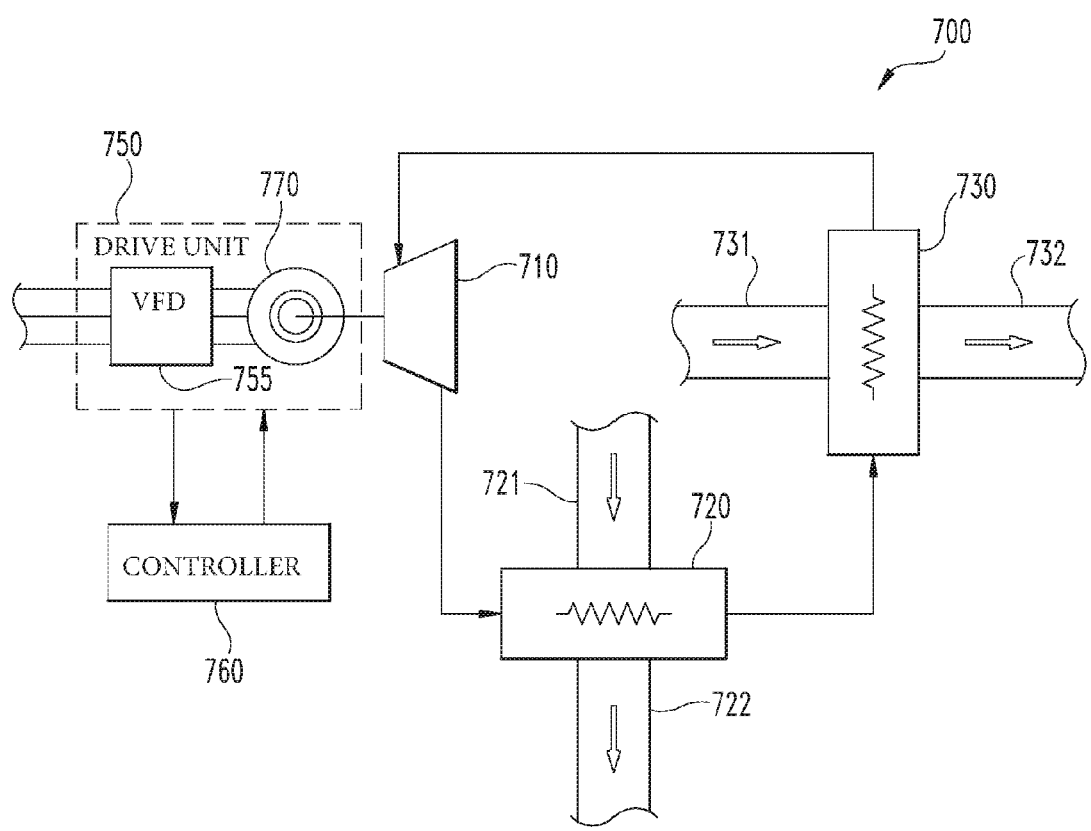
FIG. 7 is a schematic block diagram of an exemplary chiller system.

FIG. 7 illustrates an exemplary chiller system that may be used in connection with the system 100. With reference to FIG. 7 there is illustrated an exemplary chiller system 700 which includes a refrigerant loop comprising a compressor 710, a condenser 720, and an evaporator 730. Refrigerant flows through system 700 in a closed loop from compressor 710 to condenser 720 to evaporator 730 and back to compressor 710. Various embodiments may also include additional refrigerant loop elements including, for example, valves for controlling refrigerant flow, refrigerant filters, economizers, oil separators and/or cooling components and flow paths for various system components.

Compressor 710 is driven by a drive unit 750 including a permanent magnet electric motor 770 which is driven by a variable frequency drive 755. The permanent magnet electric motor 770 is one example of a motor which may be utilized in connection with the motor 150 shown in FIG. 2. Additionally, the variable frequency drive 755 illustrates an exemplary application of the variable frequency drive 104 shown in FIG. 2.

In the illustrated embodiment, variable frequency drive 755 is configured to output a three-phase PWM drive signal, and motor 770 is a surface magnet permanent magnet motor. Use of other types and configurations of variable frequency drives and permanent magnet electric motors such as interior magnet permanent magnet motors are also contemplated. It shall be appreciated that the principles and techniques disclosed herein may be applied to a broad variety of drive and permanent magnet motor configurations.

Condenser 720 is configured to transfer heat from compressed refrigerant received from compressor 710. In the illustrated embodiment, condenser 720 is a water cooled condenser which receives cooling water at an inlet 721, transfers heat from the refrigerant to the cooling water, and outputs cooling water at an output 722. It is also contemplated that other types of condensers may be utilized, for example, air cooled condensers or evaporative condensers. It shall further be appreciated that references herein to water include water solutions comprising additional constituents unless otherwise limited.

Evaporator 730 is configured to receive refrigerant from condenser 720, expand the received refrigerant to decrease its temperature and transfer heat from a cooled medium to the refrigerant. In the illustrated embodiment, evaporator 730 is configured as a water chiller which receives water provided to an inlet 731, transfers heat from the water to the refrigerant, and outputs chilled water at an outlet 732. It is contemplated that a number of particular types of evaporators and chiller systems may be utilized, including dry expansion evaporators, flooded type evaporators, bare tube evaporators, plate surface evaporators, and finned evaporators among others.

Chiller system 700 further includes a controller 760, which illustrates an exemplary application of the controller 146 shown in FIG. 2. Controller 760 outputs control signals to variable frequency drive 755 to control operation of the motor 770 and compressor 710. Controller 760 also receives information about the operation of drive unit 750. In exemplary embodiments, controller 760 receives information relating to motor current, motor terminal voltage, and/or other operational characteristics of the motor. It shall be appreciated that the controls, control routines, and control modules described herein may be implemented using hardware, software, firmware and various combinations thereof and may utilize executable instructions stored in a non-transitory computer readable medium or multiple non-transitory computer readable media. It shall further be understood that controller 760 may be provided in various forms and may include a number of hardware and software modules and components such as those disclosed herein.

Figure 8:
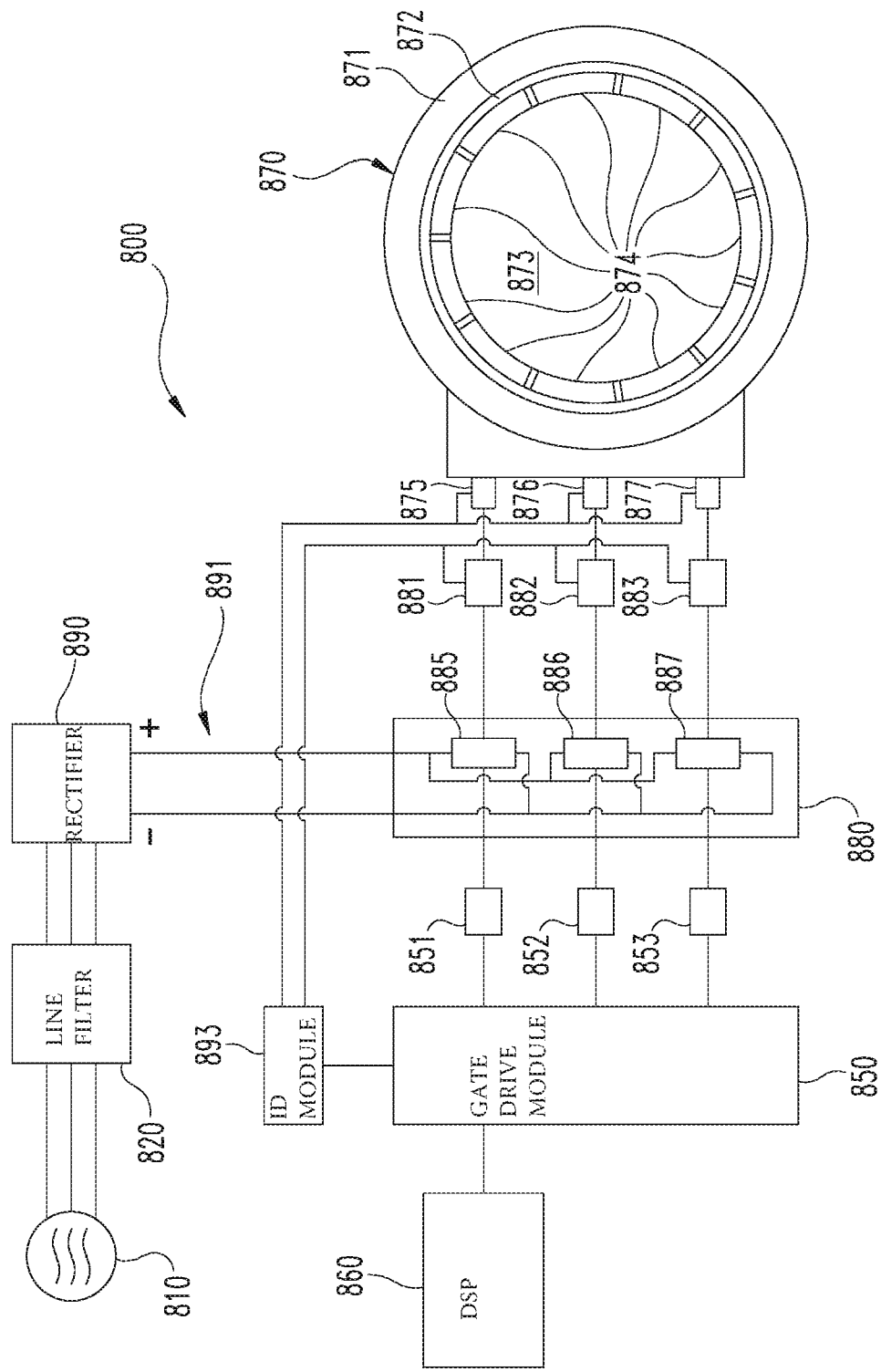
FIG. 8 is a schematic block diagram of an exemplary variable frequency drive.

FIG. 8 illustrates further details of an exemplary variable frequency drive such as the variable frequency drive 104. With reference to FIG. 8 there is illustrated an exemplary circuit diagram for a variable frequency drive 800. Drive 800 is connected to a power source 810, for example, a 400/480 VAC utility power supply which provides three-phase AC power to line filter module 820. Line filter module 820 is configured to provide harmonic damping to mitigate losses which can arise from harmonic feedback from drive components to power source 810. Line filter module 820 outputs three-phase AC power to a rectifier 890 which converts the AC power to DC power and provides the DC power to a DC bus 891. The DC bus is connected to inverter 880. For clarity of illustration and description, rectifier 890, DC bus 891, and inverter 880 are shown as discrete blocks. It shall be appreciated, however, that two or more of these components may be provided in a common module, board or board assembly which may also include a variety of additional circuitry and components. It shall be further understood that multiple pulse rectifiers such as 12-pulse, 18-pulse, 24-pulse or 30-pulse rectifiers may be utilized along with phase shifting transformers providing appropriate phase inputs for 6-pulse 12-pulse, 18-pulse, 24-pulse, or 30-pulse operation.

Inverter module 880 includes switches 885, 886 and 887 which are connected to the positive and negative lines of the DC bus 891. Switches 885, 886, and 887 are preferably configured as IGBT and diode based switches, but may also utilize other types of power electronics switching components such as power MOSFETs or other electrical switching devices. Switches 885, 886 and 887 provide output to motor terminals 875, 876 and 877. Current sensors 881, 882 and 883 are configured to detect current flowing from inverter module 880 to motor 870 and send current information to ID module 893. Voltage sensors are also operatively coupled with motor terminals 875, 876 and 877 and configured to provide voltage information from the motor terminals to ID module 893.

ID module 893 includes burden resistors used in connection with current sensing to set the scaling on current signals ultimately provided to analog to digital converters for further processing. ID module 893 tells the VFD what size it is (i.e. what type of scaling to use on current post ADC) using identification bits which are set in hardware on the ID module 893. ID module 893 also outputs current and voltage information to gate drive module 850 and also provides identification information to gate drive module 850 which identifies the type and size of the load to which gate drive module 850 is connected. ID module 893 may also provide current sensing power supply status information to gate drive module 850. ID module 893 may also provide scaling functionality for other parameters such as voltage or flux signals in other embodiments.

Gate drive module 850 provides sensed current and voltage information to analog to digital converter inputs of DSP module 860. DSP module 860 processes the sensed current and voltage information and also provides control signals to gate drive module 850 which control signals gate drive module 850 to output voltages to boost modules 851, 852 and 853, which in turn output boosted voltages to switches 885, 886 and 887. The signals provided to switches 885, 886 and 887 in turn control the output provided to terminals 875, 876 and 877 of motor 870.

Motor 870 includes a stator 871, a rotor 873, and an air gap 872 between the rotor and the stator. Motor terminals 875, 876 and 877 are connected to windings provided in stator 871. Rotor 873 includes a plurality of permanent magnets 874. In the illustrated embodiment magnets 874 are configured as surface permanent magnets positioned about the circumference of rotor 873. The rotor is typically constructed using the permanent magnets in such a way as essentially a constant magnetic flux is present at the surface of the rotor. In operation with rotation of the rotor, the electrical conductors forming the windings in the stator are disposed to produce a sinusoidal flux linkage. Other embodiments also contemplate the use of other magnet configurations such as interior magnet configurations. It shall be understood that interior magnet configurations typically have different inductances in the q-axis and the d-axis. Motor 870 is an exemplary application of motor 150 shown in FIG. 2.

While the invention has been described in connection with what is presently considered to be the preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

What is claimed is:

1. A method, comprising:
providing a variable frequency drive including a DC bus configured to provide a positive DC voltage and a negative DC voltage to an inverter, wherein the inverter includes one or more pairs of transistors, wherein an upper transistor of the one or more pairs of transistors is configured to receive the positive DC voltage and a lower transistor of the one or more pairs of transistors is configured to receive the negative DC voltage; and before operating the variable frequency drive to drive a motor, operating a controller operatively coupled with the variable frequency drive to complete a set of pre-operation tests, the set of pre-operation tests performed by the controller comprising:

testing for a short circuit condition of one or more of the transistors including switching the transistors off, measuring a voltage at a node in electrical communication with an output of one or more of the transistors, and evaluating the voltage relative to a first expected value, testing for an open circuit condition of one or more of the transistors including switching the transistors off, switching on one of the transistors, measuring a voltage at a node in electrical communication with an output of the transistor switched on, and evaluating the voltage relative to a second expected value, and testing for a sensor error condition of one or more current sensors including switching on an upper transistor coupled to a first node and switching on a lower transistor coupled to a second node, measuring a first current at the first node and a second current at the second node, and evaluating the first current and the second current relative to one another.

2. The method of claim 1, wherein the first expected value is based on one of the positive DC bus voltage and the negative DC bus voltage.

3. The method of claim 2, wherein the evaluating for a short circuit condition includes comparing the measured voltage to logic common, comparing one of the positive DC bus voltage and the negative DC bus voltage to logic common, and determining a presence or absence of a short circuit condition based on the two comparisons.

4. The method of claim 1, wherein the second expected value is based on one of the positive DC bus voltage and the negative DC bus voltage.

5. The method of claim 4, wherein the evaluating for an open circuit condition includes comparing the measured voltage to logic common, comparing one of the positive DC bus voltage and the negative DC bus voltage to logic common, and determining a presence or absence of an open circuit condition based on the two comparisons.

6. The method of claim 1, wherein the testing determines that there is a sensor error when the first current is not of equal magnitude to and not of opposite polarity to the second current.

7. The method of claim 1, further comprising:
aborting starting of the variable frequency drive based upon determining one of a short circuit condition, an open circuit condition, and a sensor failure condition.

8. The method of claim 1, further comprising:
measuring a third current at an output of the inverter when the transistors are switched off; and
recalibrating at least one of the one or more current sensors if the third current at the output of the inverter is not approximately zero amps when the transistors are switched off.

9. The method of claim 1, further comprising:
storing an error code in a non-transitory memory indicating a type of error.

10. The method of claim 1, further comprising:
starting the motor if no errors are detected.

11. A system, comprising:
a motor;
a variable frequency drive structured to provide AC power to the motor, wherein the variable frequency drive includes a DC bus and an inverter, the DC bus includes a positive DC rail and a negative DC rail, the inverter includes a switching device, and the switching device is coupled to the positive DC rail and the negative DC rail; and a controller configured to execute a set of tests prior to operating the variable frequency drive to drive a motor, the set of tests performed by the controller comprising:

test for a short circuit of the switching device including turning the switching device off, determining an output voltage at a terminal in electrical communication with an output of the switching device, and evaluating the output voltage relative to a first reference value, test for an open circuit of the switching device including turning the switching device off, turning on one at least a portion of the switching device, determining an output voltage at a terminal in electrical communication with an output of the portion of the switching device turned on, and evaluating the output voltage relative to a second reference value, and test for a sensor failure of one or more current sensors including measuring a first current at a first terminal of the switching device and measuring a second current at a second terminal of the switching device, and evaluating the first current and the second current relative to one another.

12. The system of claim 11, wherein the switching device comprises multiple pairs of transistors.

13. The system of claim 11, wherein the switching device includes at least one insulated gate bipolar transistor.

14. The system of claim 11, wherein the controller is configured to store an error code in a non-transitory memory indicating a type of failure that occurred.

15. The system of claim 11, wherein the motor is configured to drive a compressor of an HVACR system.

16. The system of claim 11, further comprising:
a positive DC voltage sensor to measure a voltage on the positive DC rail; and
a negative DC voltage sensor to measure a voltage on the negative DC rail,
wherein the first reference value is based on the voltage measured by one of the positive DC voltage sensor and the negative DC voltage sensor, and
wherein the second reference value is based on the voltage measured by one of the positive DC voltage sensor and the negative DC voltage sensor.

17. The system of claim 16, wherein the evaluating for a short circuit includes comparing the measured voltage to a common reference voltage, comparing the voltage on one of the positive DC rail and the negative DC rail to the common reference voltage, and determining a presence or absence of a short circuit based on the two comparisons.

18. The system of claim 16, wherein the evaluating for an open circuit includes comparing the measured voltage to a common reference voltage, comparing the voltage on one of the positive DC rail and the negative DC rail to the common reference voltage, and determining a presence or absence of an open circuit based on the two comparisons.

19. The system of claim 11, wherein the test for a sensor failure determines that there is a sensor failure when the first current and the second current are at least one of not equal magnitude and not opposite polarity.

20. The system of claim 11, wherein the controller is further configured to:
abort starting of the motor if there is at least one of a short circuit, an open circuit, and a sensor failure.

21. The system of claim 11, wherein the controller is further configured to:
- receive a third current measurement from one of the one or more current sensors at an output of the inverter when the switching device is turned off; and
- adjust one of the current sensors if the third current measurement is not within a predetermined range.

22. An apparatus, comprising:
a non-transitory computer readable medium configured with instructions executable by a controller to perform a set of tests as pre-conditions on operation of the variable frequency drive to drive a motor, the set of tests comprising:
- a first test for a short circuit of a switching device in an inverter including turning the switching device off, measuring an output voltage of the switching device, measuring a voltage of a DC bus coupled to the inverter, and evaluating the switching device output voltage and the DC bus voltage relative to a reference value,
- a second test for an open circuit of the switching device including turning on a portion of the switching device, measuring an output voltage of the portion of the switching device turned on, measuring the voltage of the DC bus, and evaluating the output voltage of the portion of the switching device turned on and the DC bus voltage relative to the reference value, and
- a third test for a sensor failure of one or more current sensors including measuring a first current at a first node of the switching device and measuring a second current at a second node of the switching device, and evaluating the first current and the second current relative to one another.

23. The apparatus of claim 22, wherein the switching device comprises at least one transistor.

24. The apparatus of claim 22, wherein the controller is configured to store a code in a non-transitory computer readable medium that indicates whether a short circuit condition, an open circuit condition, or a sensor failure occurred.

25. The apparatus of claim 22, wherein the reference value is logic common.

26. The apparatus of claim 22, wherein the DC bus includes a positive rail coupled to the switching device and a negative rail coupled to the switching device.

27. The apparatus of claim 22, wherein the test for a sensor failure determines that there is a sensor failure when the first current and the second current are at least one of not equal magnitude and not opposite polarity.

28. The apparatus of claim 22, wherein the instructions when executed by the controller further cause the controller to:
- preclude the inverter from providing power to a motor if there is at least one of a short circuit, an open circuit, and a sensor failure.

29. The apparatus of claim 22, wherein the instructions when executed by the controller further cause the controller to:
- adjust one of the one or more current sensors if a current measurement is not within a predetermined range when the switching device is turned off.

* * * * *